United States Patent
Takeda

(10) Patent No.: US 8,498,372 B2
(45) Date of Patent: Jul. 30, 2013

(54) COUNTER CIRCUIT AND PROTECTION CIRCUIT

(75) Inventor: Takashi Takeda, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 113 days.

(21) Appl. No.: 13/129,602

(22) PCT Filed: Nov. 24, 2009

(86) PCT No.: PCT/JP2009/069791
§ 371 (c)(1),
(2), (4) Date: May 17, 2011

(87) PCT Pub. No.: WO2010/061814
PCT Pub. Date: Jun. 3, 2010

(65) Prior Publication Data
US 2011/0221499 A1   Sep. 15, 2011

(30) Foreign Application Priority Data
Nov. 27, 2008  (JP) .................................. 2008-302135

(51) Int. Cl.
*H03K 21/16* (2006.01)
*H03K 3/356* (2006.01)

(52) U.S. Cl.
USPC ........... 377/115; 377/116; 377/117; 327/202; 327/203; 327/218

(58) Field of Classification Search
None
See application file for complete search history.

(56) References Cited

U.S. PATENT DOCUMENTS

| 4,182,961 | A  | * | 1/1980  | Dingwall ...................... 377/117 |
| 4,331,926 | A  | * | 5/1982  | Minakuchi .................... 377/110 |
| 4,545,063 | A  | * | 10/1985 | Kamimaru ..................... 377/52  |
| 4,648,103 | A  | * | 3/1987  | Welty et al. .................... 377/52  |
| 4,741,004 | A  | * | 4/1988  | Kane ............................. 377/110 |
| 5,249,214 | A  | * | 9/1993  | Ulmer et al. .................. 377/121 |
| 5,438,600 | A  | * | 8/1995  | Seki et al. ...................... 377/47  |
| 6,282,255 | B1 | * | 8/2001  | La Rosa et al. ................ 377/47  |
| 6,411,669 | B1 | * | 6/2002  | Kim .............................. 377/48  |
| 6,504,407 | B2 | * | 1/2003  | Park et al. .................... 327/115 |
| 6,741,670 | B2 | * | 5/2004  | Tester .......................... 377/107 |

FOREIGN PATENT DOCUMENTS

| JP | 64-024504  | 1/1989  |
| JP | 03-262317  | 11/1991 |
| JP | 07-095047  | 4/1995  |
| JP | 2002-186173 | 6/2002  |

OTHER PUBLICATIONS

International Search Report mailed on Dec. 15, 2009.

* cited by examiner

*Primary Examiner* — Tuan T Lam
(74) *Attorney, Agent, or Firm* — IPUSA, PLLC

(57) ABSTRACT

A counter circuit is provided that can switch delay times by use of a simple circuit configuration. A counter circuit includes plural stages of flip flops connected in cascade, in which a flip flop in a first stage receives a clock from an oscillator as an input signal, and a flip flop in a given stage after the first stage receives a Q output of a preceding stage as an input signal, wherein all or part of the plural stages of flip flops receive a mode signal, and wherein each of the plural stages of flip flops divides by 2 a frequency of the received input signal for output as a Q output when the mode signal indicates a normal delay mode, and each stage of the flip flops that receives the mode signal allows through passage of the received input signal for output as a Q output when the mode signal indicates a delay shortened mode.

6 Claims, 6 Drawing Sheets

COUNTER CIRCUIT AND PROTECTION CIRCUIT

TECHNICAL FIELD

The disclosures herein generally relate to electronic circuits, and particularly relate to a counter circuit comprised of plural stages of trigger-type flip flops connected in cascade and to a protection circuit provided with such a counter circuit.

BACKGROUND ART

In recent years, lithium ion batteries have been used in portable apparatuses such as digital cameras. A lithium ion battery is easily damaged from overcharging or overdischarging, and is thus provided in a battery pack having a circuit to provide protection from overcharging and overdischarging.

A battery pack is provided with a protection IC (integrated circuit). A protection IC (integrated circuit) has an overcharge detection circuit, an overdischarge detection circuit, an overcurrent detection circuit, and the like embedded therein. Upon detection of overdischarge or overcurrent by the overdischarge detection circuit or the overcurrent detection circuit, an MOS transistor is turned off to stop discharging from the lithium ion battery. Further, upon detection of overcharge by the overcharge detection circuit, an MOS transistor is turned off to stop charging the lithium ion battery.

The above-noted overcharge detection circuit, overdischarge detection circuit, and overcurrent detection circuit measure respective detection time. When the detection time exceeds a predetermined time (i.e., delay time), overcharge detection, overdischarge detection, and overcurrent detection are accepted as true detection to turn off the MOS transistor, thereby avoiding malfunction. Namely, a predetermined length of time needs to pass before overcharge detection, overdischarge detection, and overcurrent detection are accepted as true detection.

The problem is that, since a predetermined length of time (i.e., delay time) is necessary for overcharge detection, overdischarge detection, and overcurrent detection, it takes a lengthy time to test protection ICs upon manufacturing thereof. In consideration of this, the above-noted predetermined length of time (i.e., delay time) is shortened or eliminated by setting a short time mode to the protection ICs at the time of testing.

Patent Document 1, for example, discloses switching the delay time of a comparator output between a normal-delay-time mode, a shortened-delay-time mode, and a no-delay-time mode based on a check as to which one of a high level (VDD), a middle level (VDD/2), and a low level (VSS) is applied as an input level to a test terminal.

In the related-art circuit, one of the three types of varied time modes, i.e., the normal-delay-time mode, the shortened-delay-time mode, and the no-delay-time mode, is selected by setting the input level of the test terminal to one of the high level (VDD), the middle level (VDD/2), and the low level (VSS).

Accordingly, the related-art circuit may need two inverters, one NOR gate, and three NAND gates as a check circuit for checking which one of the high level (VDD), the middle level (VDD/2), and the low level (VSS) is the input level of the test terminal. Further, a charge current to a condenser in an oscillator is changed (i.e., increased/decreased) in response to the result of a check made by the check circuit. With this arrangement, the oscillating frequency is adjusted (i.e., high/low) to switch the delay time.

This arrangement gives rise to problems in that the related-art circuit has a complex circuit configuration because of the need for such a check circuit, and in that a change in the charge current to the condenser may result in the detection accuracy of the overcharge detection circuit and the overdischarge detection circuit being lowered.

RELATED-ART DOCUMENTS

Patent Document

[Patent Document 1] Japanese Patent Application Publication No. 2002-186173

SUMMARY OF THE INVENTION

Problem to be Solved by Invention

Accordingly, it may be desired to provide a counter circuit that can switch delay times by use of a simple circuit configuration, and to provide a protection circuit having such a counter circuit embedded therein.

Means to Solve the Problem

According to one embodiment, a counter circuit includes plural stages of flip flops connected in cascade, in which a flip flop in a first stage receives a clock from an oscillator as an input signal, and a flip flop in a given stage after the first stage receives a Q output of a preceding stage as an input signal, wherein all or part of the plural stages of flip flops receive a mode signal, and wherein each of the plural stages of flip flops divides by 2 a frequency of the received input signal for output as a Q output when the mode signal indicates a normal delay mode, and each stage of the flip flops that receives the mode signal allows through passage of the received input signal for output as a Q output when the mode signal indicates a delay shortened mode.

According to one embodiment, a protection circuit for controlling charging and discharging of a battery includes a detection circuit to generate a detection signal upon detecting at least one of overcharging, overdischarging, charge overcurrent, and discharge overcurrent with respect to the battery, a clock circuit to generate a clock signal in response to the detection signal, a counter circuit to count the clock signal, and a logic circuit to generate a control signal in response to an output of the counter circuit, wherein the counter circuit includes plural stages of flip flops connected in cascade, in which a flip flop in a first stage receives a clock from an oscillator as an input signal, and a flip flop in a given stage after the first stage receives a Q output of a preceding stage as an input signal, wherein all or part of the plural stages of flip flops receive a mode signal, and wherein each of the plural stages of flip flops divides by 2 a frequency of the received input signal for output as a Q output when the mode signal indicates a normal delay mode, and each stage of the flip flops that receives the mode signal allows through passage of the received input signal for output as a Q output when the mode signal indicates a delay shortened mode.

Advantage of the Invention

According to at least one embodiment, a simple circuit configuration can switch delay times.

MODE FOR CARRYING OUT THE INVENTION

In the following, embodiments of the invention will be described with reference to the accompanying drawings.

Based on the drawings, the embodiments of the invention will be described.

<Counter Circuit>

Figure 1:
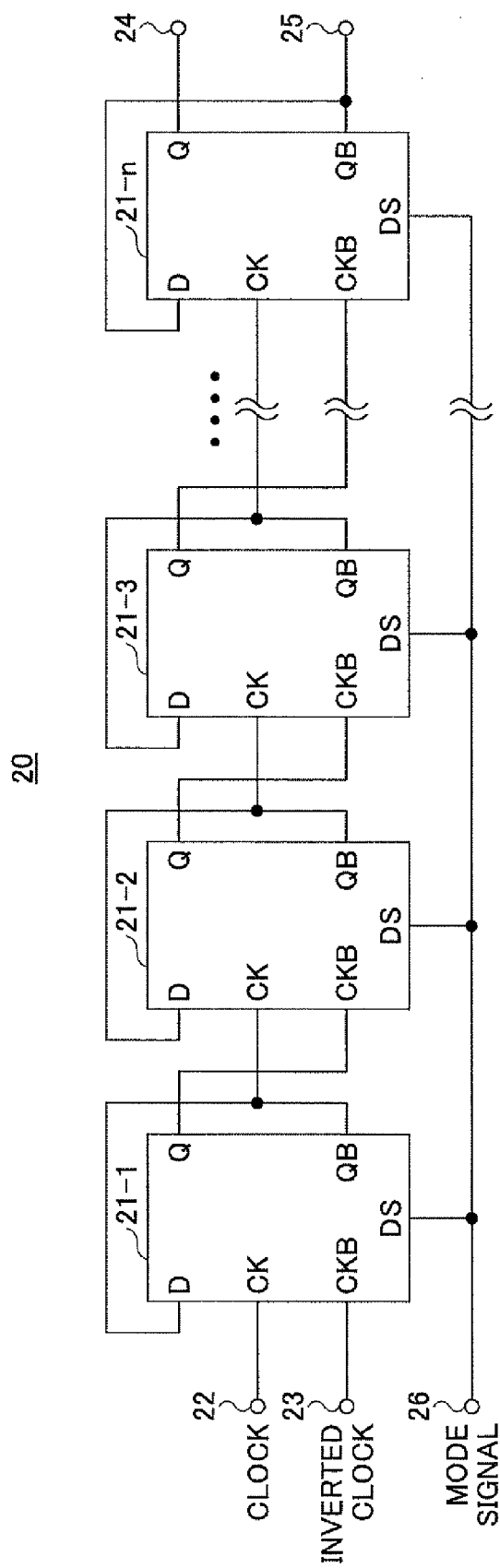
FIG. 1 is a drawing illustrating a circuit configuration of an embodiment of a counter circuit.

FIG. 1 is a drawing illustrating a circuit configuration of an embodiment of a counter circuit. In the figure, a counter circuit 20 includes D-type flip flops 21-1 through 21-$n$ provided with a control terminal CNT. A terminal 22 receives a clock from an oscillator, and supplies the clock to the CK terminal of the flip flop 21-1. A terminal 23 receives an inverted clock that is an inverse of the clock from the oscillator, and supplies the inverted clock to the CKB terminal of the flip flop 21-1.

The Q terminal of the flip flop 21-1 is connected to the CKB terminal of the next-stage flip flop 21-2. The QB terminal (which outputs an inverse of the Q terminal) of the flip flop 21-1 is connected to the 0 terminal of the flip flop 21-1 to constitute a trigger-type flip flop, and is also connected to the CK terminal of the next-stage flip flop 21-2. Each of the flip flops 21-1 through 21-$n$ constitutes a trigger-type flip flop, thereby performing ½ frequency division with respect to the D terminal input.

The flip flops 21-2 through 21-$n$ also have the QB terminal connected to the D terminal, thereby constituting trigger-type flip flops. The flip flops 21-1 through 21-$n$ are connected in cascade such that the CK terminal and the CKB terminal are connected to the QB terminal and the Q terminal of the preceding stage, respectively. The Q terminal and QB terminal of the flip flop 21-$n$ are connected to terminals 24 and 25, respectively.

The DS terminals of the respective flip flops 21-1 through 21-$n$ are connected to a terminal 26 to receive a mode signal.

<Flip Flop>

Figure 2:
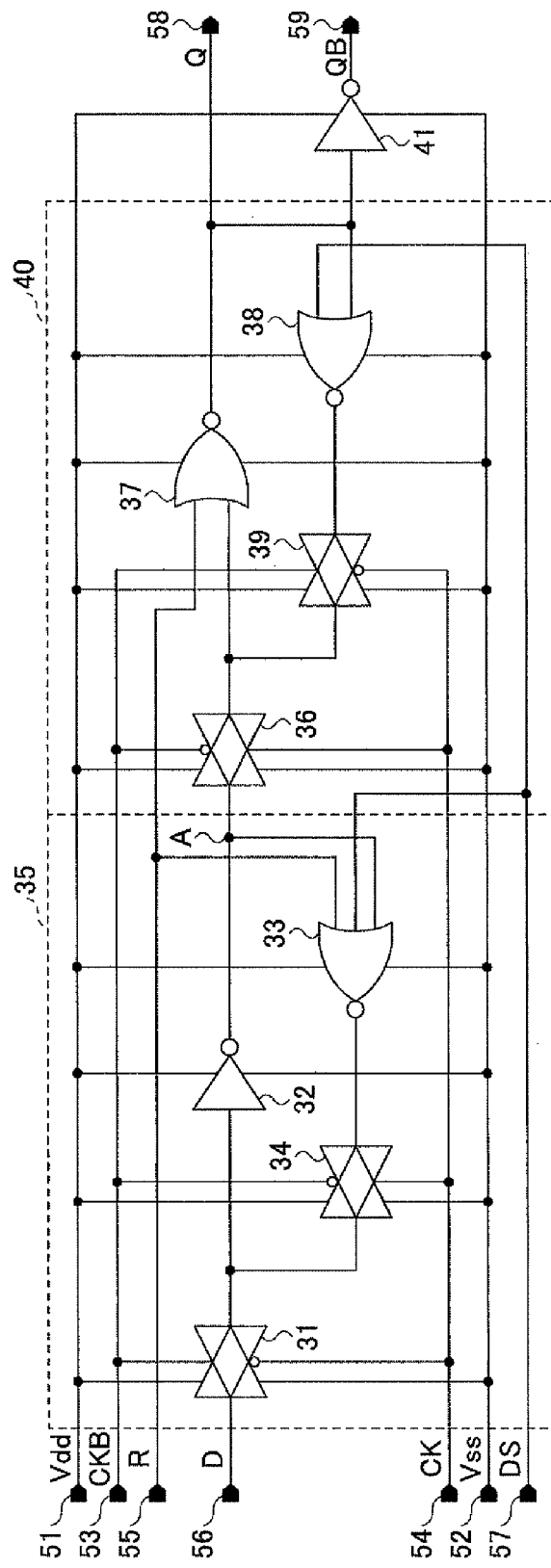
FIG. 2 is a drawing illustrating a circuit configuration of an embodiment of a flip flop.

FIG. 2 is a drawing illustrating the circuit configuration of the embodiment of the D-type flip flops 21-1 through 21-$n$ provided with a control terminal CNT. In the figure, a first-stage latch circuit 35 in which an analog switch 31, an inverter 32, a NOR gate 33, and an analog switch 34 constitute a latch loop is provided. Also, a second-stage latch circuit 40 in which an analog switch 36, a NOR gate 37, a NOR gate 38, and an analog switch 39 constitute a latch loop is provided. Further, an inverter 41 is provided.

Power supply voltages Vdd and Vss from terminals 51 and 52 are supplied to each circuit element. An inverse clock and a clock input from a CKB terminal 53 and a CK terminal 54, respectively, are supplied to the control terminals of the analog switches 31, 34, 36, and 39. A reset signal input from a R terminal 55 is supplied to input terminals of the NOR gates 33 and 37. A data signal input from a D terminal 56 is supplied to the input terminal of the analog switch 31. A mode signal (which indicates a normal delay mode by a low level and a shortened delay mode by a high level) input from a DS terminal 57 is supplied to input terminals of the NOR gates 33 and 38. The output of the NOR gate 37 is output from a Q terminal 58. A signal obtained by inverting the output of the NOR gate 37 through the inverter 41 is output from a QB terminal 59.

It may be noted that inverters would be used in place of the NOR gates 33, 37, and 38 in the case of a typical latch circuit. In the present embodiment, however, the NOR gates 33, 37, and 38 which serve as inverters when the DS terminal 57 receives a low-level input are used. In consideration of this, the inverter 41 is provided for the purpose of outputting an inverse of the Q terminal 58 from the QB terminal 59 regardless of whether the input from the DS terminal 57 is a high level or a low level.

<Operation of Counter Circuit, DS: Low Level (Normal Delay Mode)>

A description will first be given of an operation when the input from the DS terminal 57 is a low level. When the input from the DS terminal 57 is at the low level, the NOR gate 38 functions as an inverter.

Upon a high-level reset signal being supplied to the R terminal 55, the outputs of the NOR gates 33 and 37 become a low level, and the output of the NOR gate 38 becomes a high level.

When the R terminal 55 subsequently changes to a low level, the NOR gates 33 and 37 function as an inverter.

When the input from the CKB terminal 53 is at a high level, and the input from the CK terminal 54 is at a low level, the analog switch 31 is turned on, and the analog switch 34 is turned off. With this, the first-stage latch circuit 35 inverts the input signal from the D terminal 56 with the NOR gate 32, and supplies the inverted signal to the second-stage latch circuit 40 via a point A. Further, the analog switch 36 is turned off, and the analog switch 39 is turned on, so that the second-stage latch circuit 40 latches the state of the Q terminal with the latch loop (37, 38, 39) for output from the Q terminal 58. The output from the Q terminal 58 is supplied to the D terminal 56 as illustrated in FIG. 1.

When the input from the CKB terminal 53 is at a low level, and the input from the CK terminal 54 is at a high level, the analog switch 31 is turned off, and the analog switch 34 is turned on. With this, the first-stage latch circuit 35 latches the state at the point A with the latch loop (32, 33, 34) for provision to the second-stage latch circuit 40. Further, the analog switch 36 is turned on, and the analog switch 39 is turned off, so that the second-stage latch circuit 40 inverts the signal at the point A with the NOR gate 37 for output from the Q terminal 58. The output from the Q terminal 58 is supplied to the D terminal 56 as illustrated in FIG. 1.

Figure 3:
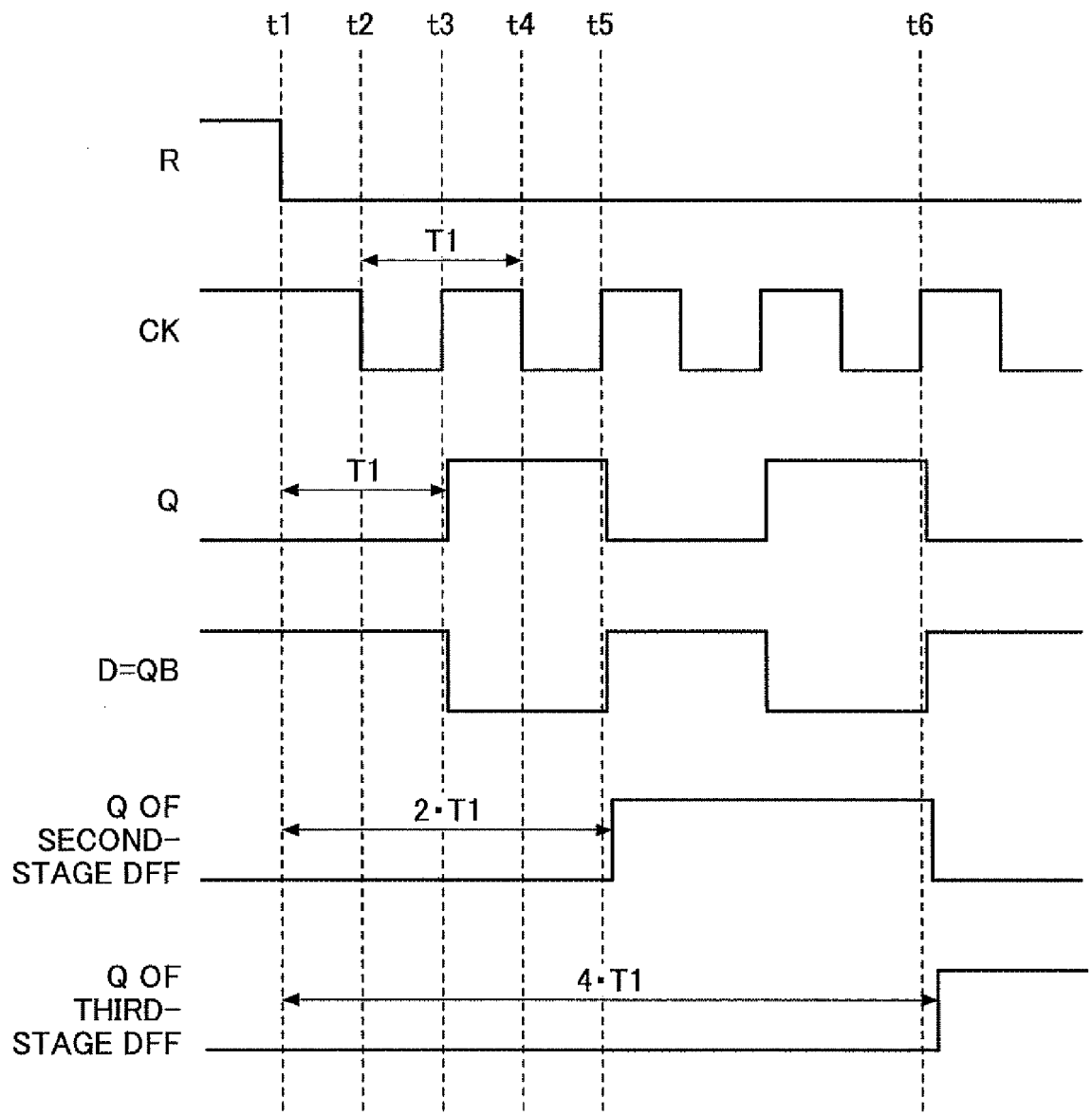
FIG. 3 is a drawing illustrating signal waveforms in a normal delay mode.

As illustrated in FIG. 3, the clock at the terminal 22 falls at timing t2 after the R terminal 55 becomes a low level at timing t1. Thereafter, the clock at the terminal 22 rises (first time) at timing t3, resulting in a rise in the output of the Q terminal 58 of the flip flop 21-1 and a fall in the output of the QB terminal 59. Further, the clock at the terminal 22 rises (second time) at timing t5, resulting in a rise in the output of the Q terminal 58 of the flip flop 21-2 and a fall in the output of the QB terminal 59. Moreover, the clock at the terminal 22 rises (fourth time) at timing t6, resulting in a rise in the output of the Q terminal 58 of the flip flop 21-3 and a fall in the output of the QB terminal 59.

Namely, the first-stage flip flop divides by 2 the frequency of the clock supplied at the terminal 22, so that the counter circuit 20 divides by $2^n$ the frequency of the clock supplied from the oscillator for output.

<Operation of Counter Circuit, DS: High Level (Shortened Delay Mode)>

A description will be given of an operation when the input from the DS terminal 57 is a high level. When the input from the DS terminal 57 is at the high level, the NOR gates 33 and 38 produce low-level fixed outputs. When the R terminal 55 becomes a low level, the NOR gate 37 functions as an inverter.

When the input from the CKB terminal 53 is at a high level, and the input from the CK terminal 54 is at a low level, the analog switch 31 is turned on, and the analog switch 34 is turned off. With this, the first-stage latch circuit 35 inverts the input signal from the D terminal 56 with the NOR gate 32, and supplies the inverted signal to the second-stage latch circuit 40 via a point A. Further, the analog switch 36 is turned off, and the analog switch 39 is turned on, so that the second-stage latch circuit 40 inverts the low-level fixed output of the NOR gate 38 with the NOR gate 37 to produce a high level for output from the Q terminal 58. The output from the Q terminal 58 is supplied to the D terminal 56 as illustrated in FIG. 1.

When the input from the CKB terminal 53 is at a low level, and the input from the CK terminal 54 is at a high level, the analog switch 31 is turned off, and the analog switch 34 is turned on. With this, the first-stage latch circuit 35 inverts the low-level fixed output of the NOR gate 33 with the NOR gate 32 to produce a high level for provision to the second-stage latch circuit 40. Further, the analog switch 36 is turned on, and the analog switch 39 is turned off, so that the second-stage latch circuit 40 inverts the signal at the point A with the NOR gate 37 to produce a low level for output from the Q terminal 58. The output from the Q terminal 58 is supplied to the D terminal 56 as illustrated in FIG. 1.

Figure 4:
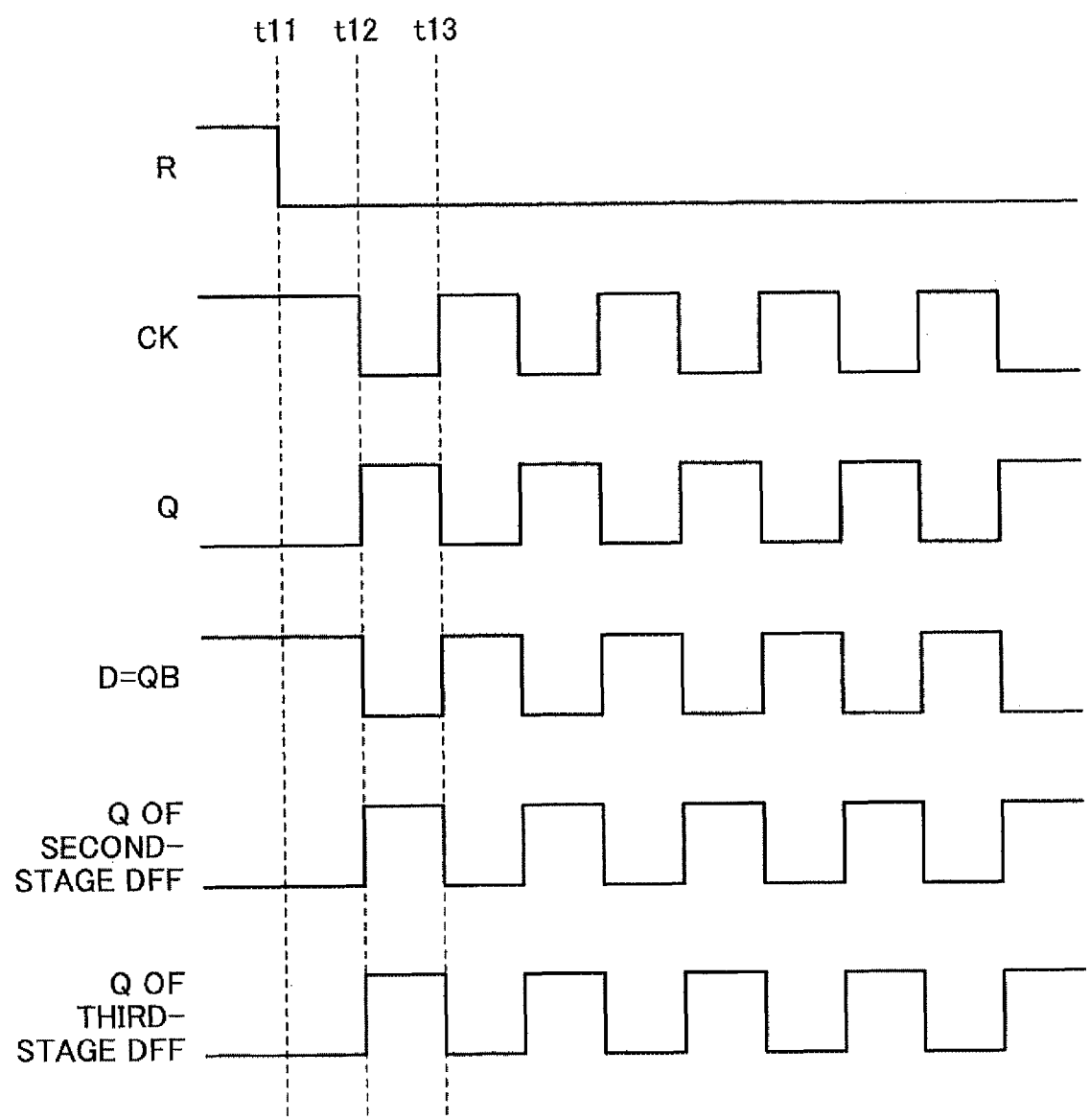
FIG. 4 is a drawing illustrating signal waveforms in a delay shortened mode.

As illustrated in FIG. 4, the clock at the terminal 22 falls at timing t12 after the R terminal 55 becomes a low level at timing t11, resulting in a rise in the output of the Q terminal 58 of the flip flop 21-1 and a fall in the output of the QB terminal 59. Thereafter, the clock at the terminal 22 rises at timing t13, resulting in a fall in the output of the Q terminal 58 of the flip flop 21-1 and a rise in the output of the QB terminal 59. Namely, with the mode signal supplied from the terminal 26 being at a high level, the counter circuit 20 allows through passage of the clock supplied from the oscillator for output therefrom. Because of this, the delay time becomes equal to the period of one clock of the oscillator output clock.

<Variation of Counter Circuit>

Figure 5:
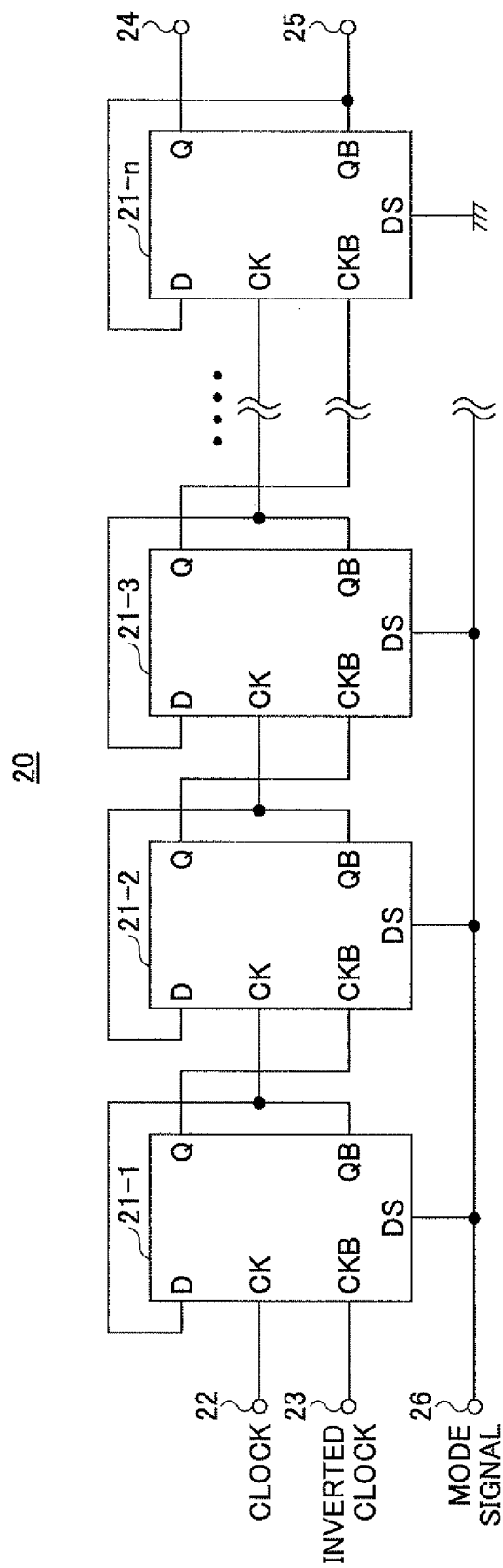
FIG. 5 is a drawing illustrating a circuit configuration of a variation of the embodiment of a counter circuit.

FIG. 5 is a drawing illustrating a circuit configuration of a variation of the embodiment of a counter circuit. In the figure, a counter circuit 20 includes D-type flip flops 21-1 through 21-n provided with a control terminal CNT. A terminal 22 receives a clock from an oscillator, and supplies the clock to the CK terminal of the flip flop 21-1. A terminal 23 receives an inverted clock that is an inverse of the clock from the oscillator, and supplies the inverted clock to the CKB terminal of the flip flop 21-1.

The Q terminal of the flip flop 21-1 is connected to the CKB terminal of the next-stage flip flop 21-2. The QB terminal (which outputs an inverse of the Q terminal) of the flip flop 21-1 is connected to the D terminal of the flip flop 21-1 to constitute a trigger-type flip flop, and is also connected to the CK terminal of the next-stage flip flop 21-2.

The flip flops 21-2 through 21-n also have the same connections, thereby constituting trigger-type flip flops. The flip flops 21-1 through 21-n are connected in cascade. The Q terminal and QB terminal of the flip flop 21-n are connected to terminals 24 and 25, respectively.

The DS terminals of the flip flops 21-1 through 21-(n–1), excluding the last-stage flip flop, are connected to the terminal 26 to receive a mode signal. The DS terminal of the last-stage flip flop is connected to the ground.

In this variation, with the mode signal supplied from the terminal 26 being at a high level, the flip flops 21-1 through 21-(n–1), excluding the last-stage flip flop, allow through passage of the clock supplied from the oscillator for output therefrom. The clock output from the flip flop 21-(n–1) is 1/n-frequency-divided by the last-stage flip flop 21-n for output from the terminal 24. Because of this, the delay time becomes equal to the period of two clocks of the oscillator output clock.

Similarly, the DS terminals may be connected to the ground with respect to the m flip flops from the last stage of the flip flops 21-1 through 21-n. In this case, the delay time becomes equal to the period of $2^m$ clocks of the oscillator output clock. In this manner, latitude in selecting a delay time in the shortened delay mode can be increased.

<Protection IC>

Figure 6:
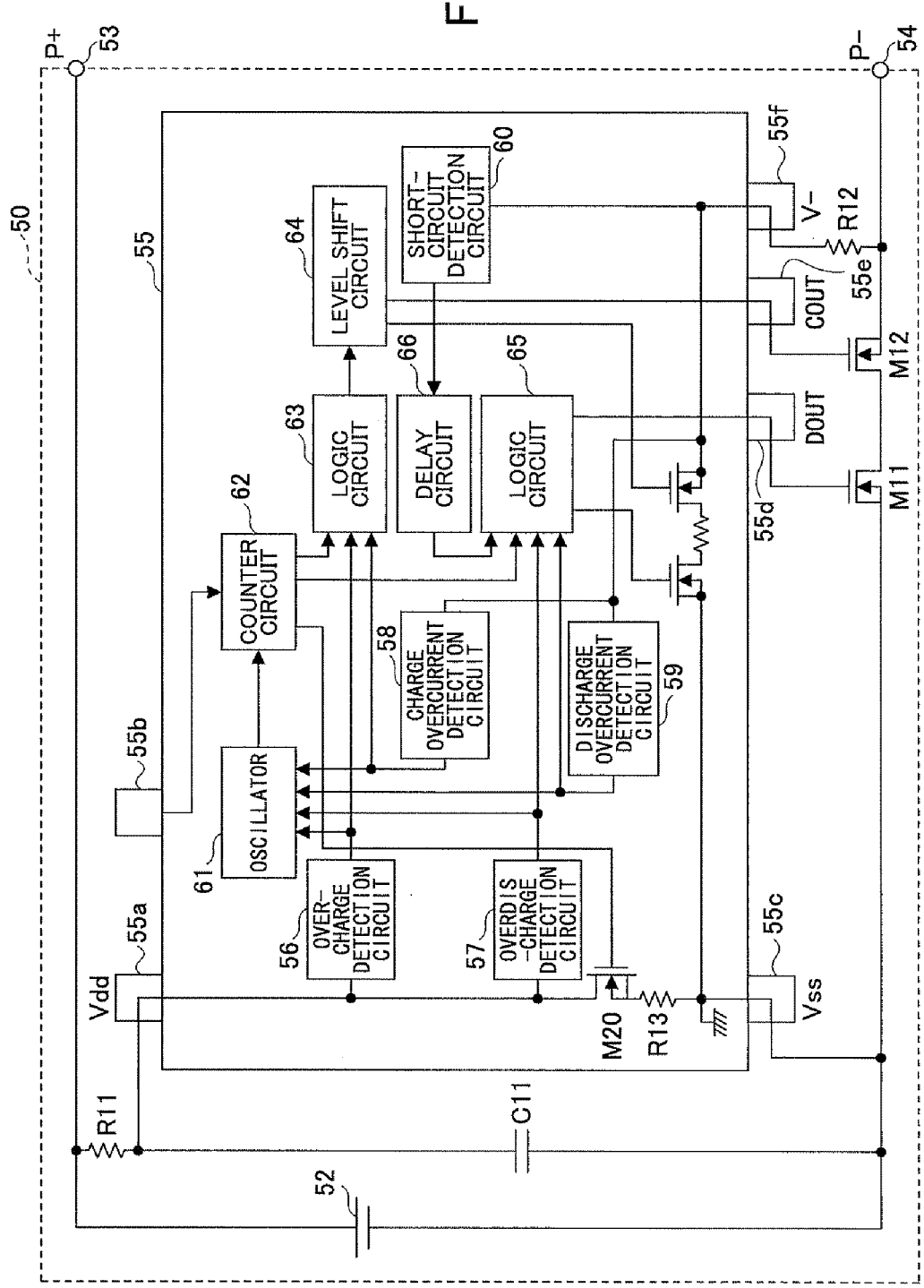
FIG. 6 is a block diagram illustrating an embodiment of a battery pack.

FIG. 6 is a block diagram illustrating an embodiment of a battery pack in which the counter circuit is applied to the protection IC. A series-connected resistor R11 and condenser C11 are connected to a lithium ion battery 52 in parallel. The positive terminal of the lithium ion battery 52 is coupled through a wire connection to an external terminal (P+) 53 of a battery pack 50. The negative terminal is coupled through a wire connection to an external terminal (P−) 54 of the battery pack 50 through n-channel MOS transistors M11 and M12 provided for current interruption purposes.

The MOS transistors M11 and M12 have the drains thereof connected together. The source of the MOS transistor 11 is connected to the negative terminal of the lithium ion battery 52. The source of the MOS transistor 12 is connected to the external terminal 54.

A protection IC (protection circuit) 55 operates with the power supply voltage VDD at a terminal 55a supplied from the positive terminal of the lithium ion battery 52 through the resistor R11 and the power supply voltage VSS at a terminal 55c supplied from the negative terminal of the lithium ion battery 52.

Further, the protection IC 55 receives at a terminal 55b a mode setting signal from an external source, and has a terminal 55f connected to one end of a resistor R12, with the other end of the resistor R12 being connected to the external terminal 54. A terminal 55d of the protection IC 55 for the DOUT output is connected to the gate of the MOS transistor M11, and a terminal 55e of the protection IC 55 for the COUT output is connected to the gate of the MOS transistor M12.

The protection IC 55 has an overcharge detection circuit 56, an overdischarge detection circuit 57, a charge overcurrent detection circuit 58, a discharge overcurrent detection circuit 59, and a short-circuit detection circuit 60 embedded therein. The overcharge detection circuit 56 detects overcharging of the lithium ion battery 52 based on the voltages at the terminals 55a and 55c to apply a detection signal to an oscillator 61 and a logic circuit 63. The overdischarge detection circuit 57 detects over-discharging of the lithium ion battery 52 based on the voltages at the terminals 55a and 55c to apply a detection signal to the oscillator 61 and a logic circuit 65.

The charge overcurrent detection circuit 58 detects an overcurrent condition based on the voltage at the terminal 55f in which a current flowing through the MOS transistor M11 and the MOS transistor rM12 becomes excessively large, thereby to apply a detection signal to the logic circuit 61 and the logic circuit 63. The discharge overcurrent detection circuit 59 detects an overcurrent condition based on the voltage at the terminal 55f in which a current flowing through the MOS transistor M11 and the MOS transistor rM12 becomes excessively large, thereby to apply a detection signal to the logic circuit 61 and the logic circuit 65. The short-circuit detection circuit 60 detects short-circuit between the external terminals 53 and 54 based on the voltage at the terminal 55f to supply a detection signal from a delay circuit 66 to the logic circuit 65.

The terminal (DS) 55b of the protection IC 55 is connected to a counter circuit 62. The counter circuit 62 has the circuit configuration illustrated in FIG. 1 (or FIG. 5). The terminals 22 and 23 of FIG. 1 receive a clock and an inverted clock, respectively, from the oscillator 61. The output of the counter circuit 62, i.e., the output from the terminal 24 of FIG. 1, is supplied to the logic circuit 63 and the logic circuit 65.

At the time of charging (i.e., the MOS transistors M11 and M12 are ON), the oscillator 61 oscillates to produce a clock signal upon a detection signal being output by the overcharge detection circuit 56 or the charge overcurrent detection circuit 58. Upon a predetermined number of clock signals being counted by the counter circuit 62, a high level signal is supplied to the logic circuit 63 After receiving the above-noted detection signal, and upon receiving the high level signal from the counter circuit 62, the logic circuit 63, sets a control signal to a low level for provision to the gate of the MOS transistor M12 to stop charging. This control signal is level-shifted by a level-shift circuit 64 to be lowered by a predetermined amount for provision to the gate of the MOS transistor M12 through the terminal 55e. With this, charging of the lithium ion battery 52 is stopped. This level shift is performed because the external terminal 54 is at lower voltage than the terminal 55c.

At the time of discharging (i.e., the MOS transistors M11 and M12 are ON), the oscillator 61 oscillates to produce a clock signal upon a detection signal being output by the overdischarge detection circuit 57 or the discharge overcurrent detection circuit 59. Upon a predetermined number of clock signals being counted by the counter circuit 62, a high level signal is supplied to the logic circuit 65 After receiving the above-noted detection signal, and upon receiving the high level signal from the counter circuit 62, the logic circuit 65 sets a control signal to a low level for provision to the gate of the MOS transistor M11 to stop discharging. This control signal is supplied to the gate of the MOS transistor M11 through the terminal 55d.

The detection signal of the short-circuit detection circuit 60 is delayed by the delay circuit 66 similarly to the delay created by the counter circuit 62 for provision to the logic circuit 65. The logic circuit 65 sets a control signal to a low level for provision to the gate of the MOS transistor M11 to stop discharging. This control signal is supplied to the gate of the MOS transistor M11 through the terminal 55d. With this, discharging of the lithium ion battery 52 is stopped.

Unlike a related-art circuit, the present embodiment does not change (i.e., increase/decrease) a charge current to a condenser in the oscillator 61 to adjust (i.e., make high/low) the oscillating frequency for delay time adjustment. In the present embodiment, thus, a change in the delay time does not cause a change in the charge current of the oscillator 61, so that the current flowing to the resistor R11 from the lithium ion battery 52 does not change. Accordingly, voltage accuracy detected by the overcharge detection circuit 56 and the overdischarge detection circuit 57, i.e., detection accuracy, is not reduced.

Further, the present invention is not limited to these embodiments, but various variations and modifications may be made without departing from the scope of the present invention.

DESCRIPTION OF REFERENCE SYMBOLS 21-1 to 21-n flip flops
31, 36 analog switch
32, 41 inverter
33, 37, 38 NOR gate
34, 39 analog switch
35 first-stage latch circuit
40 second-stage latch circuit

The invention claimed is:

1. A counter circuit, comprising:
plural stages of flip flops connected in cascade, in which a flip flop in a first stage receives a clock from an oscillator as an input signal, and a flip flop in a given stage after the first stage receives a Q output of a preceding stage as an input signal,
wherein all or part of the plural stages of flip flops receive a mode signal, and wherein each of the plural stages of flip flops divides by 2 a frequency of the received input signal for output as a Q output when the mode signal indicates a normal delay mode, and each stage of the flip flops that receives the mode signal allows through passage of the received input signal for output as a Q output when the mode signal indicates a delay shortened mode,
wherein at least one of the plural stages of flip flops includes:
a first latch circuit including a first analog switch to load input data at a D terminal, a first inversion element to invert an output of the first analog switch, a second inversion element to invert an output of the first inversion element, and a second analog switch to form a loop with the first and second inversion elements; and
a second latch circuit including a third analog switch to load output data of the first latch circuit, a third inversion element to invert an output of the third analog switch, a fourth inversion element to invert an output of the third inversion element, and a fourth analog switch to form a loop with the third and fourth inversion elements, and
wherein the second and fourth inversion elements produce a fixed output at a redetermined level when the mode signal indicates the delay shortened mode.

2. The counter circuit as claimed in claim 1, wherein the flip flops excluding each stage of the flip flops that receives the mode signal divide by 2 a frequency of the received input signal for output as a Q output when the mode signal indicates the delay shortened mode.

3. The counter circuit as claimed in claim 1, wherein each stage of the flip flops that receives the mode signal makes a level transition in the Q output at every turn in response to each rising edge and falling edge of the received input signal when the mode signal indicates the delay shortened mode.

4. A protection circuit for controlling charging and discharging of a battery, comprising:
a detection circuit to generate a detection signal upon detecting at least one of overcharging, overdischarging, charge overcurrent, and discharge overcurrent with respect to the battery;
a clock circuit to generate a clock signal in response to the detection signal;
a counter circuit to count the clock signal; and
a logic circuit to generate a control signal in response to an output of the counter circuit,
wherein the counter circuit includes:
plural stages of flip flops connected in cascade, in which a flip flop in a first stage receives a clock from an oscillator as an input signal, and a flip flop in a given stage after the first stage receives a Q output of a preceding stage as an input signal,
wherein all or part of the plural stages of flip flops receive a mode signal, and wherein each of the plural stages of flip flops divides by 2 a frequency of the received input signal for output as a Q output when the mode signal indicates a normal delay mode, and each stage of the flip flops that receives the mode signal allows through passage of the received input signal for output as a Q output when the mode signal indicates a delay shortened mode, wherein at least one of the plural stages of flip flops includes:

a first latch circuit including a first analog switch to load input data at a D terminal, a first inversion element to invert an output of the first analog switch, a second inversion element to invert an output of the first inversion element, and a second analog switch to form a loop with the first and second inversion elements; and a second latch circuit including a third analog switch to load output data of the first latch circuit, a third inversion element to invert an output of the third analog switch, a fourth inversion element to invert an output of the third inversion element, and a fourth analog switch to form a loop with the third and fourth inversion elements, and wherein the second and fourth inversion elements produce a fixed output at a predetermined level when the mode signal indicates the delay shortened mode.

5. The protection circuit as claimed in claim 4, wherein the flip flops excluding each stage of the flip flops that receives the mode signal divide by 2 a frequency of the received input signal for output as a Q output when the mode signal indicates the delay shortened mode.

6. The protection circuit as claimed in claim 4, wherein each stage of the flip flops that receives the mode signal makes a level transition in the Q output at every turn in response to each rising edge and falling edge of the received input signal when the mode signal indicates the delay shortened mode.

* * * * *